United States Patent [19]

Coben

[11] Patent Number: 4,814,693

[45] Date of Patent: Mar. 21, 1989

[54] DATA CABLE TEST APPARATUS AND METHOD

[76] Inventor: Melvin S. Coben, 283 E. Northfield Rd., Livingston, N.J. 07039

[21] Appl. No.: 16,540

[22] Filed: Feb. 19, 1987

[51] Int. Cl.$^4$ ............ H04B 3/46; G01R 19/00; G01R 31/02

[52] U.S. Cl. .................... 324/66; 324/540; 324/542

[58] Field of Search ............ 379/10, 21, 25; 324/540, 66, 133, 542

[56] References Cited

U.S. PATENT DOCUMENTS

| | | | |
|---|---|---|---|
| 3,217,244 | 11/1965 | Glover | 324/540 |
| 3,681,686 | 8/1972 | Connally | 379/25 |
| 3,818,329 | 6/1974 | Reaves | 324/66 |
| 4,203,066 | 5/1980 | Buck | 324/133 |
| 4,418,312 | 11/1983 | Figler | 324/540 |
| 4,471,293 | 9/1984 | Schnack | 324/540 |
| 4,575,588 | 3/1986 | Vande Vyer | 324/66 |

FOREIGN PATENT DOCUMENTS

| | | | |
|---|---|---|---|
| 0122169 | 9/1980 | Japan | 324/66 |
| 0066366 | 4/1982 | Japan | 324/66 |

Primary Examiner—Reinhard J. Eisenzopf
Assistant Examiner—Jose M. Solis
Attorney, Agent, or Firm—Lerner, David, Littenberg, Krumholz & Mentlik

[57] ABSTRACT

Apparatus and methods for testing multiconductor data cables. A test connector having plural elements is engaged with one connector of the data cable, and a test signal is applied to a preselected common element of the test connector. The test signal is conducted through one conductor of the data cable to a connector on a breakout box and terminals on the breakout box are interconnected with one another while the presence or absence of the test signal at elements of the test connector other than the common element is detected.

12 Claims, 3 Drawing Sheets

DATA CABLE TEST APPARATUS AND METHOD

BACKGROUND OF THE INVENTION

The present invention relates to apparatus and methods for testing multiconductor data cables.

Multiconductor data cables are widely utilized in the data communications field. For example, such cables are employed in connecting remote terminals to computers. Data cables typically must provide many separate circuits to perform various specialized functions. Many common data cables are constructed according to the EIA (Electronic Industries Association) standard RS-232C. Cables according to this standard may have 25 separate conductors and may be provided at each end with connectors having 25 separate connecting elements such as pins or sockets. The individual pins or sockets of such connectors are designated according to a predetermined numbering scheme. In a simple or "straight through" cable, each connecting element of one connector is connected only to the corresponding element of the connector at the opposite end of the cable. Many cables, however, employ customized interconnection patterns. Thus, some of the conductors or elements in the connectors may be omitted. Also, some of the conductors may interconnect differently designated elements in the two conductors as, for example, where element number two of one connector is connected to element number three of the connector on the opposite end of the cable and vice versa. Also, some of the elements of a connector may be interconnected with one another. Testing all of the separate circuits provided by a typical data cable, and checking the pattern of interconnections in the cable is a difficult task. These difficulties are aggravated if an already installed cable must be tested. Thus, the two ends of the cable may be disposed in two different rooms.

Although numerous portable devices have been used by field service technicians for testing data cables, none of these have been truly satisfactory in all respects. Some simple devices can be used only where both ends of the cable are in close proximity to one another, and hence cannot be used to test an installed cable. Other portable cable testers which can be used to test an installed cable are expensive or are incapable of testing all aspects of cable configuration. Thus, there has been a significant need for improved data cable testing apparatus, and similar needs for improved methods of testing a data cable.

SUMMARY OF THE INVENTION

The present invention meets these needs.

One aspect of the present invention incorporates the realization that a common tool already possessed by every data communications technician, referred to as a "breakout box" can be a valuable adjunct in cable testing. A breakout box incorporates one or more connectors adapted to engage the connectors of a data cable and also includes a plurality of terminals. Each terminal on the breakout box is connected to one element in the connector on the box. The breakout box typically is connected by the technician to cables carrying actual signals, so that the technician can connect test apparatus to the individual terminals or so that the technician can deliberately interconnect different conductors in the cable by interconnecting the various terminals of the breakout box, as with jumper wires or the like. Heretofore, such breakout boxes have been used principally for testing the data processing equipment rather than for testing the cables per se.

Test apparatus according to one aspect of the present invention includes first test connector means, such as a standard plug, having a plurality of elements. The first test connector means is adapted to engage one of the multi-element cable connectors on the cable to be tested. The test connector means includes a plurality of elements, such as pins or sockets, corresponding to the elements in the cable connectors. These elements include in the test connector means one or more preselected common elements and a plurality of other elements. When the cable connector is engaged with the test connector means, each element in the cable connector is connected to the corresponding element of the test connector means. Source means are provided for applying a test signal to each common element of the first test connector means, and detector means are provided for detecting the presence or absence of the test signal at each of the other elements of the first test connector means and indicating whether or not the test signal is present at each of these other elements. For example, where the test connector means is, an RS-232C connector, the pin or socket in the number one position may serve as the common element. The detector means preferably includes means for providing a visible indication associated with each of the other elements in the test connector means as to whether or not the test signal is present. Thus, the detector means can include an illuminator such as a light emitting diode connected to each of the other elements in the test connector means. The power source means may be as simple as a potential source such as a battery connected to the common element in the first connector means, so as to apply the battery voltage as the test signal at the common element. The illuminators or light emitting diodes are arranged so that they will operate in response to the test signal, i.e., the battery voltage.

The test apparatus can be employed in cable testing methods according to a further aspect of the invention. One of the cable connectors on the cable to be tested is engaged with the test connector means, so that each element of the cable connector mates with the corresponding element on the first test connector means. The second cable connector, at the opposite end of the cable to be tested is engaged with the connector of a breakout box. Thus, each element of the second cable connector mates with an element of the connector on the breakout box and each element of the second cable connector is thus connected to a terminal of the breakout box. The test signal, such as the battery potential, is applied to the common element of the test connector means and carried through one conductor of the cable to the other end of the cable. Thus, the test signal is routed to a preselected terminal, designated as the common terminal, on the breakout box. By interconnecting the common terminal on the breakout box with other terminals on the breakout box, the test signal is successively routed to different elements of the second cable connector at the end of the cable remote from the test apparatus. Where there is a continuous circuit through the cable connecting the selected element of the second cable connector to an element of the first cable connector at the test apparatus, the test signal will be carried back to that element of the first cable connector and hence to the corresponding element of the first test connector means. For example, where the cable to be tested conforms to the RS-232C standard, and the test connector is an RS-232C connector, the element at position number one in the test connector may be designated as the common element. So long as the cable has an intact lead connecting position number one at the first cable connector (engaged with the test connector) to position number one at the opposite cable connector (engaged with the breakout box) the test signal will be carried to the breakout box terminal associated with position number one. By interconnecting this terminal with the other terminals of the breakout box in sequence, the test signal can be applied to the elements of the second cable connector at each of the other positions, i.e., positions 2–25. If there is any interconnection between one of these elements and one of the elements 2–25 in the first cable connector, the test signal or battery potential will be carried back through that interconnection to the appropriate element in the first cable connector. Therefore, the test signal will appear at the corresponding element of the test connector and the associated illuminator will glow to indicate the connection. By observing which illuminators glow when any given terminal at the breakout box is interconnected with the common terminal, the technician can determine the pattern of interconnections between the first and second cable connectors in the cable.

Because the test signal is carried from the test apparatus to the breakout box over one conductor of the cable being tested and back from the breakout box to the test apparatus over the cable, there is no need to string temporary or jumper cables between the opposite ends of the cable under test. Therefore, methods and apparatus according to these aspects of the present invention are particularly well-suited for testing installed cables, as where the ends of the cables are disposed in different rooms. Further, because the breakout box provides a convenient way to select any circuit in the cable for testing, the test apparatus itself need not incorporate any provision for accomplishing this function. Therefore, the test apparatus can be extraordinarily simple and inexpensive.

Preferably, the test apparatus includes a second test connector means as well. The second test connector means is connected in parallel with the first. Thus, each element in the second test connector means is connected with the corresponding element in the first test connector means. Therefore, the first and second test connector means can be used interchangeably. The first test connector means ordinarily is a connector having one gender whereas the second test connector means is a similar connector having the opposite gender. This permits use of the test apparatus with cables of any gender. Moreover, as further explained below, the dual, parallel connected test connectors on the test apparatus can be used in a further cable test method for checking interconnections between elements on cable connectors even where the elements involved are not connected to the opposite end of the cable.

Other objects, features and advantages of the invention will be more readily apparent from the detailed description of the preferred embodiment set forth below, taken in conjunction with the accompanying drawings.

DETAILED DESCRIPTION OF THE PREFERRED EMBODIMENTS

Figure 2:
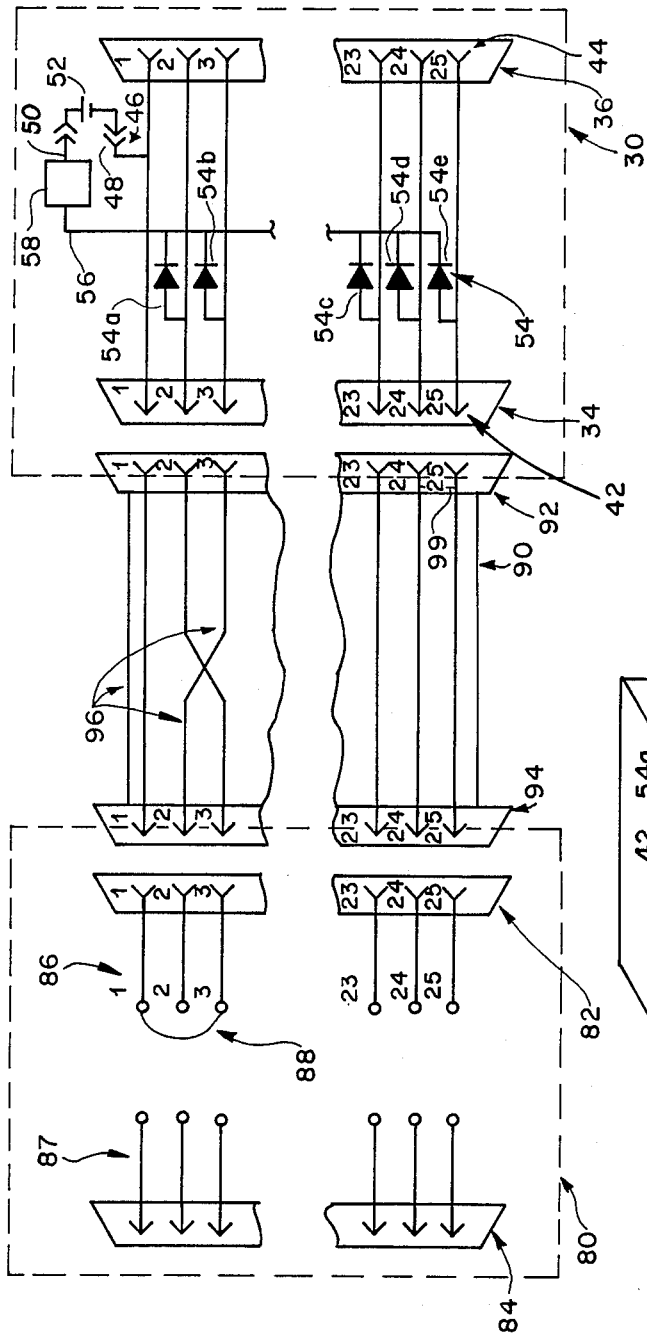
FIG. 2 is a fragmentary schematic view of the cable test apparatus shown in FIG. 1, together with a cable and a breakout box during one step of a method in accordance with one embodiment of the present invention.

A cable tester according to one embodiment of the present invention includes a housing 30 having a front wall 32. A first test connector 34 and a second test connector 36 are mounted to a circuit board 38 within housing 30 so that connectors 34 and 36 protrude through holes 40 in front wall 32. Connectors 34 and 36 are both EIA RS-232C data cable connectors, each having 25 conductive elements arranged in a predetermined, standard pattern. First test connector 34 is a male connector. The conductive elements 42 of first test connector 34 are pins. Second test connector 36 is a female connector having elements 44 in the form of sockets. Each element 42 of first connector 34 is connected directly to the corresponding element 44 of second test connector 36. For example, pin on first test connector 34 is connected directly to socket on second connector 36, pin 2 on first test connector 34 is connected directly to socket 2 on second test connector 36 and so on. A battery holder 46 having a pair of terminals 48 and 50 is mounted within housing 30. The battery holder is arranged to engage a standard 9 volt transistor radio battery 52 so that predetermined opposite potentials will be applied to terminals 50 and 48 by the battery. Element 1 of each test connector 34 and 36 is a common element. These common elements—the common pin 1 of first test connector 34 and the common socket 1 of second test connector 36 are both connected to terminal 48 of the battery holder. Thus, when a battery is engaged in the holder these common elements will be maintained at a test potential corresponding to the potential at battery terminal or node 48 and different from the ground potential at terminal or node 50.

Each element of first test connector 34, other than common element or pin 1, is connected to one side of an individual illuminator or light emitting diode 54. Thus, pin or element 2 is connected to diode 54a, pin 3 is connected to diode 54b and so on. Because each element of the first test connector 34 is connected directly to the corresponding element of the second test connector 36, each element of the second test connector is also connected to the same diode as the corresponding element of the first test connector. Thus, socket 2 of second test connector 36 is connected to the same side of diode 54a as pin 2 on first test connector 34 and so on. The second pole of each diode 54 is connected to a bus 56 which in turn is connected to one side of a piezoelectric annunciator or buzzer 58. The other side of buzzer 58 is connected directly to the ground node or terminal 50 of battery holder 46.

The light emitting diodes 54 are physically mounted on circuit board 38 in an ordered, linear array. Typically, all of diodes 54 are formed as elements in a preassembled diode array and this preassembled diode array is physically attached to the circuit board. The diodes 54 are positioned on the circuit board so that they are aligned with a hole 60 in the front face 32 of housing 30. A translucent label 62 covers hole 60 and diodes 54. Label 62 has individual indicia 64 corresponding to the individual diodes. These indicia are aligned with the diodes so that each diode 54 is disposed behind indicia calling out the element number associated with that diode. For example, diode 54a is connected to element number two on each of test connector means 34 and 36, and this diode is aligned behind the numeral "2" on label 62. As will be appreciated, light emitting diodes 54a and buzzer 58 serve to detect the presence of the test potential from battery terminal or node 48 at any of the elements 2-25 of either connector 34 or 36. If the common element 1 of connector 34 is somehow connected to element 2 on either or both of connectors 34 or 36, the test potential from node 48 will be applied to diode 54a, thus causing a current to flow through the diode and causing diode 54a to illuminate. The illuminated diode 54a will illuminate the numeral "2" on label 62, thus indicating that the test potential is present at element 2 of one of the test connectors 34 or 36. Also, when the test potential from terminal or node 48 is applied to any of elements 2-25 on either of test connectors 34 or 36, the test potential is applied through the associated diode to one side of annunciator or buzzer 58 which produces an audible tone in response.

As will be readily appreciated, the test apparatus according to this aspect of the present invention is extraordinarily simple and hence extraordinarily economical and reliable. It has no moving parts or switches whatsoever and requires no maintenance other than periodic renewal of the battery. As the device draws power only briefly during each test, average power consumption typically is so low that battery life is limited by self-discharge rather than power consumption.

The test apparatus according to this embodiment of the present invention can be utilized in conjunction with a conventional breakout box 80. The breakout box per se is a conventional tool used by data communications technicians. As is well-known, the breakout box typically includes at least one, and usually two, breakout box connectors 82, which are also multi-element connectors. The particular breakout box illustrated has two breakout box connectors 82 and 84, connector 82 being a female RS-232C connector and connector 84 being the corresponding male RS-232C connector. Each element of connector 82 is associated with an accessible terminal in a terminal array 86 and electrically connected thereto. Thus, socket 1 of connector 82 is electrically connected to terminal 1 of the terminal array 86, socket 2 of connector 82 is connected to terminal 2 of the same array 86 and so on. A jumper cable 88 is provided for selectively interconnecting the terminals on the breakout box with one another.

In one test method according to the present invention, the aforementioned test apparatus and breakout box are employed to test a data cable 90 having a first multi-element cable connector 92 at a first end, a second multi-element connector 94 at the opposite, second end of the cable and a plurality of conductors 96 interconnecting the elements of these two cable connectors. The object of the test is to verify the pattern of interconnections between the elements of the two cable connectors. The cable connectors of course are configured to mate with the test connectors 34 and 36 on the test apparatus, and with the similar breakout box connectors 82 and 84 on breakout box 80. In the test, first cable connector 92 is engaged with first test connector 34 so that each element of the first cable connector 92 mates with the corresponding element of first test connector 34. The second cable connector 94 is engaged with breakout box connector 82, so that the elements of second cable connector 94 mate with the corresponding elements of the breakout box connector. Thus, each element in second cable connector 94 is connected to one of the terminals 86 on the breakout box. Because the terminals 86 are associated with the elements of connector 82 in a predetermined order, the interconnections between the elements of connector 94 and the terminals 86 of the breakout box will always be known. Thus, element or pin 1 of connector 94 will always be connected to terminal 1 of the breakout box, whereas pin 2 of connector 94 will always be connected to terminal 2 on the breakout box and so on.

The battery 52 in the test apparatus applies the test potential to common element 1 of first test connector 34, and hence to the corresponding socket 1 of first cable connector 92. The conductor 96 extending between socket 1 of first cable connector 92 and pin 1 of second cable connector 94 will carry the test potential to that pin, and hence the test potential will be applied to terminal 1 of the terminal array 86 on the breakout box. Thus, terminal 1 of the breakout box terminal array serves as a common terminal, carrying the test potential. Jumper cable 88 is then employed to connect terminal 1 of the breakout box to each of the other terminals in terminal array 86 in succession, one terminal at a time. Thus, the test potential is applied in succession to each of the elements 2-25 in second cable connector 94.

By monitoring the illumination of diodes 54 in the test apparatus, the technician can determine the pattern of interconnections between the ends of cable 90. For example, the conductor extending between elements 23 of connectors 92 and 94 is an ordinary "straight through" conductor, extending between correspondingly numbered elements of both cable connectors. Therefore, when the jumper cable 88 is engaged with terminal 23 of terminal array 86, the test potential will be applied through this conductor to element 23 of first test conductor 34 and hence the associated diode 54c will illuminate, thus illuminating the numeral "23" on label 62. Also, annunciator 58 will emit a tone. By contrast, the conductors 96 on pins 2 and 3 of connector 94 are inverted within the cable, so that element 2 of second cable connector 94 is connected to element 3 of first cable connector 92, and vice versa. When jumper cable 88 is engaged with terminal 2 of the breakout box, diode 54b will illuminate and will light the numeral "3" on label 62 on the front of the test apparatus, whereas when terminal 3 on the breakout box is engaged the numeral "2" will be illuminated by diode 54a. Also, when terminal 24 is engaged, there will be no sound emitted and none of the diodes will illuminate because terminal 24 on second test conductor 94 is not connected through any of the conductors 96 to any of the elements on first test connector 92. Element 25 of the second cable connector 94 is connected through to element 25 of the first cable connector 92, but this element is interconnected with element 24 on the first cable connector by a local jumper 99. Thus, when terminal 25 of the breakout box terminal array 86 is engaged by the jumper cable 88, both diodes 54d and 54e will illuminate, thus illuminating both numerals "24" and "25" on the test apparatus.

This test method offers a simple way for the technician to determine all of the end-to-end connections within the data cable 90. Because the breakout box provides convenient terminals for interengagement with the jumper cable 88, there is no need for the technician to fumble with a delicate probe such as might be necessary to directly probe individual pins or sockets of the data cable. Moreover, the test can be conducted even where the data cable is installed and extends between remote locations, such as where the data cable has one end in one room and another end in another room. A technician working at one end with a helper at the opposite end of the cable can conduct the test as described. Typically, the helper and technician would remain in communication by telephone during the test.

As will be apparent, the test described above requires a reliable straight through interconnection between element 1 in cable connector 92 and element 1 in cable connector 94 so as to carry the test signal to the breakout box. Ordinarily, this poses no problem because most data cables utilize the "1" position as a frame ground connection. However, in certain rare situations the frame ground connection is omitted. To deal with these situations, a temporary jumper cable can be installed at the unused test connector. For example, a jumper cable can be installed between common element 1 and element 23 of second test connector 36, to thereby connect element 23 of first test connector 34 to the test potential from node 48. In effect, element 23 is converted into a common element and terminal 23 of the breakout box terminal array becomes the new common terminal. The remainder of the test is performed substantially as described above.

Figure 4:
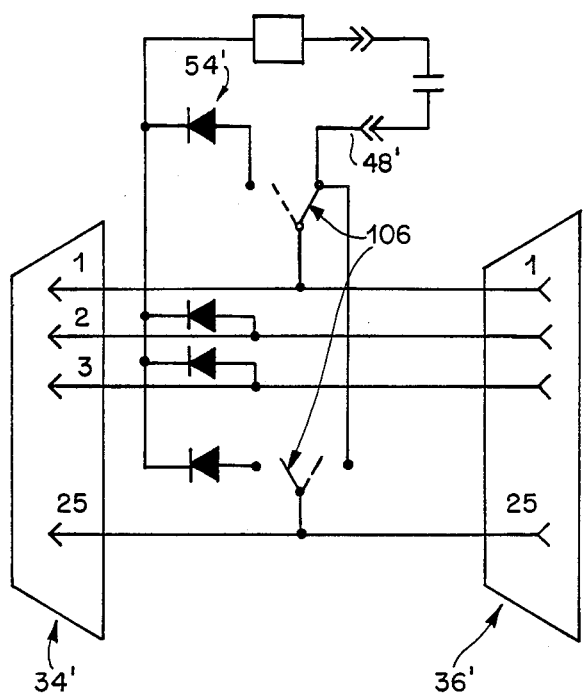
FIG. 4 is a fragmentary schematic view showing portions of an apparatus in accordance with a further embodiment of the invention.

Test apparatus according to a further embodiment of the invention is provided with an internal switch for selectively interconnecting test potential nodes with different elements on the test connector to facilitate use of different elements as the common element. As shown in FIG. 4, a double pole, double throw switch 106 is provided for connecting element 1 of test connectors 34' and 36' either to the test potential node 48' as shown in solid lines or to one of the diodes 54' and for connecting element 25 of the test connectors either to test potential node 48' or to one of the diodes 54'. The double pole, double throw switch 106 is arranged so that when element 1 is connected to the test potential node 48' element 25 is connected to one of the diodes, and vice versa. Thus, by actuating switch 106, the technician can use either element 1 or element 25 as the common element.

Figure 1:
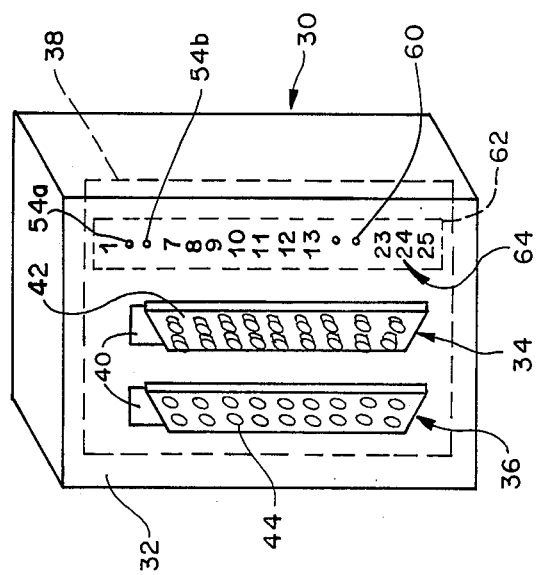
FIG. 1 is a diagrammatic perspective view of a cable test apparatus according to one embodiment of the present invention.
Figure 3:
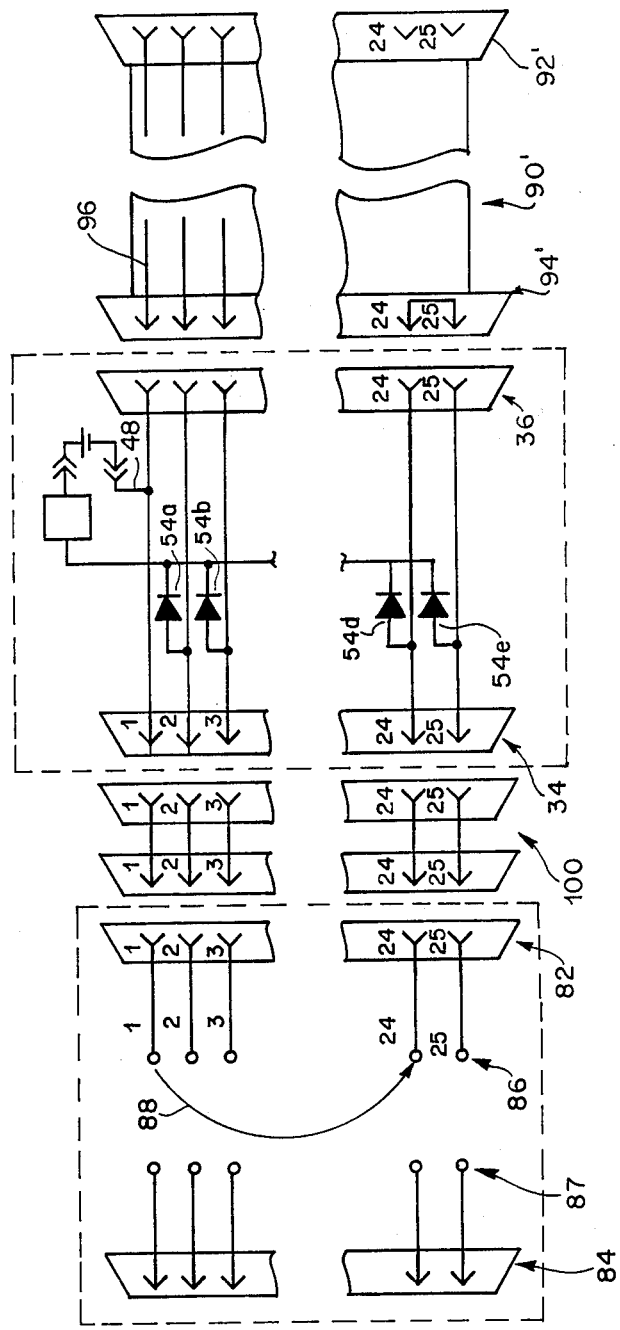
FIG. 3 is schematic view similar to FIG. 2, depicting a step of a further method according to the invention.

The test method as described above provides useful information regarding the end-for-end interconnections in the cable, and also some information about jumpers, such as jumper 99 (FIG. 1) installed between some of the elements in individual cable connectors. However, this test does not identify all possible configurations. As shown in FIG. 3, one of the cable connectors 94' may include elements, such as the elements 24 and 25, which are interconnected with one another but which are not connected to the corresponding elements of the other cable connector 92'. The test method illustrated in FIG. 3 can be employed to test for this condition. Here, the first test connector 34 of the test apparatus is linked in a "straight through" connection to breakout box connector 82. This may be accomplished either by directly engaging connector 34 with breakout box connector 82 or, as shown, by connecting a known "straight through" data cable patch cord 100 between these two connectors. Thus, each element of first test connector 34 is connected to the corresponding element of the breakout box connector and hence to the corresponding pin in the pin array 86. Common element 1 of connector 34 is thus again connected to terminal 1 on the breakout box, so that terminal 1 serves as a common terminal carrying the test potential from test potential node 48.

One cable connector 94' of the data cable 90' to be tested is engaged with the second test connector 36, so that each element of the data cable connector 94' mates with the corresponding element of the test connector 36. Jumper cable 88 is again employed to sequentially interconnect common terminal 1 with the other terminals on the breakout box. Of course, because all of the terminals of first test connector 34 are connected "straight through" to the corresponding terminals of the first test connector 34, the test potential will always be applied to one of the terminals on the first test connector 34 during each such interconnection using the jumper cable 88. Therefore, the diode 54 corresponding to the engaged terminal in the terminal array 86 will always illuminate. For example, where terminal 3 is engaged, diode 54b will glow and illuminate numeral "3." However, because the first and second test connectors 34 and 36 are connected to one another, and because connector 94' is engaged with the second test connector, any interconnection of the elements in cable connector 94' will transmit the test potential back through to a second diode, causing two diodes to illuminate simultaneously. For example, where terminal 24 is engaged, the test potential is transmitted not only to diode 54d but also to diode 54e by the interconnection between elements 24 and 25 of cable connector 94'. Thus, the technician can identify any interconnections between elements of a cable connector by noting the illumination of two diodes simultaneously. This test alone does not tell the technician whether the elements of cable connector 94' are interconnected within that cable connector or whether both elements are connected through conductors to the opposite cable connector 92' and interconnected there. However, in conjunction with the end-for-end interconnection data derived from the test illustrated in FIG. 2, the technician can determine where the interconnection lies. Also, this test typically is repeated but applied to the opposite cable connector 92'. In this repeat test, the roles of the first and second test connectors 34 and 36 are reversed to provide the proper gender. Thus, second test connector 36 is linked to breakout box connector 84 and the terminal array 87 associated with that connector 84 is employed in the test, while cable connector 92' is engaged with first test connector 34. In other respects, the repeat test is exactly the same.

As will be readily appreciated, numerous variations and combinations of the features described above can be employed. Merely by way of example, annunciator 58 can be omitted or replaced by a fixed resistor. Also, the diodes 54 can be replaced by any other form of illuminator. Visual indicators other than illuminators can be employed as well. Moreover, although it is definitely preferred to use a simple potential as supplied by battery 52 as the test signal, other test signals, such as predetermined wave forms or the like can be applied to the common element, provided that the detectors incorporated in the test apparatus can detect these other signals. The apparatus and methods described above can be employed with any form of multi-conductor data cable and with any type of connector, provided that the test connectors and data cable connectors will mate with one another. Thus, the apparatus can be made with any configuration of test connector as required. Also, multiple test connectors can be provided with various configurations on the same test apparatus. As these and other variations and combinations of the features described above can be utilized without departing from the invention as defined by the claims, the foregoing description of the preferred embodiments should be taken as illustrating and not as limiting the invention as defined in the claims.

What is claimed is:

1. Apparatus for testing, repairing or reconfiguring a data cable connected to a conventional breakout box wherein the data cable has a pair of multi-element cable connectors and conductors interconnecting elements of the cable connectors with one another, and the conventional breakout box has a breakout box connector connected to one of the cable connectors, the apparatus comprising:
    (a) first test connector means having a plurality of elements including one or more common elements and a plurality of other elements for engaging one of said cable connectors so that each element of the engaged cable connector mates with a corresponding element of said first test connector means;
    (b) source means for applying a test signal to each said common element of said first test connector means; and
    (c) detector means for detecting said test signal at each said other element of said first test connector means and indicating whether or not said test signal is present at each said other element, thereby enabling the testing of the data cable when the cable connectors are in remote locations from one another.

2. Apparatus as claimed in claim 1 wherein said detector means includes means for providing a visible indication associated with each said other element of said first test connector means as to whether or not said test signal is present.

3. Apparatus as claimed in claim 2 wherein said source means includes power source means having a test potential node and a ground potential node and means for connecting said test potential node to each said common element of said first test connector means, said detector means including a plurality of illuminator means for emitting light in response to a potential applied thereto, each said illuminator means being connected to one of said other elements of said first test connector means.

4. Apparatus as claimed in claim 3 further comprising annunciator means for emitting an audible signal in response to a potential applied thereto, said illuminator means being connected to said ground potential node by way of said annunciator means.

5. Apparatus as claimed in claim 3 wherein said power source means includes a battery holder having a pair of battery terminals adapted to releasably engage a storage battery, each said battery terminal constituting one of said nodes.

6. Apparatus as claimed in claim 3 further comprising second test connector means for engaging one of said cable connectors, said second test connector means having a plurality of elements corresponding to the elements of said first test connector means, said elements of said second test connector means including at least one common element and a plurality of other elements, each said element of said second test connector means being connected to the corresponding element of said first test connector means.

7. Apparatus as claimed in claim 6 wherein said first test connector means is a connector having one gender and said second test connector means is a corresponding connector having the opposite gender.

8. Apparatus as claimed in claim 7 wherein said connectors are RS-232 connectors.

9. Apparatus as claimed in claim 1 further comprising switch means for selectively interconnecting any one of a plurality of said elements in said first test connector means to said test potential node so that any of said plurality of elements can be used as a common element.

10. A method of testing, repairing or reconfiguring a data cable connected to a conventional breakout box, wherein the data cable has a first multi-element cable connector at a first end, a second multi-element cable connector at a second end and a plurality of conductors interconnecting elements of said cable connectors with one another, and the breakout box has a multi-element breakout box connector connected to a second cable connector, the method comprising the steps of:
    (a) engaging said first cable connector with a test connector so that each element of said first cable connector mates with one element of said first test connector;
    (b) engaging said second cable connector with a connector on the breakout box so that each element of said second cable connector mates with one element of said connector on said breakout box and each element of said second cable connector is thus connected to a corresponding terminal of said breakout box;
    (c) applying a test signal to a preselected common element of said test connector, so that said test signal is conducted through one conductor of said cable to said second cable connector and to a preselected common terminal on said breakout box; and
    (d) sequentially interconnecting said common terminal on said breakout box with other terminals on said breakout box while detecting the presence or absence of said test signal at the elements of said test connector other than said common element.

11. A method as claimed in claim 10 wherein said step of detecting said test signal at said other elements of said test connector includes the step of monitoring all of said other elements of said test connector and providing a separate visual indication for each said other element of said test connector as to the presence or absence of said test signal.

12. A method as claimed in claim 11 wherein said step of applying a test signal to said common element of said connector includes the step of applying a predetermined test potential to said common element of said test connector and said step of monitoring each of said other elements of said first test connector includes the step of monitoring a separate illuminator connected between each said other element of said test connector and a ground potential different from said test potential.

* * * * *